(12) United States Patent
Choo et al.

(10) Patent No.: US 10,859,875 B2
(45) Date of Patent: Dec. 8, 2020

(54) METHOD FOR FORMING PATTERN FOR LIQUID CRYSTAL ORIENTATION OF ZENITHAL BI-STABLE LIQUID CRYSTAL PANEL, LIQUID CRYSTAL ORIENTATION SUBSTRATE INCLUDING PATTERN FORMED THEREBY, AND MASK SUBSTRATE USED FOR FORMING PATTERN

(71) Applicant: LG CHEM, LTD., Seoul (KR)

(72) Inventors: So Young Choo, Daejeon (KR); Jin Soo Lee, Daejeon (KR); Eun Kyu Her, Daejeon (KR); Bu Gon Shin, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/491,552

(22) PCT Filed: Feb. 13, 2018

(86) PCT No.: PCT/KR2018/001898
§ 371 (c)(1),
(2) Date: Sep. 5, 2019

(87) PCT Pub. No.: WO2018/164388
PCT Pub. Date: Sep. 13, 2018

(65) Prior Publication Data
US 2020/0033656 A1    Jan. 30, 2020

(30) Foreign Application Priority Data

Mar. 7, 2017  (KR) .................. 10-2017-0028839

(51) Int. Cl.
*G02F 1/1337* (2006.01)
*G02F 1/139* (2006.01)
(Continued)

(52) U.S. Cl.
CPC ........ *G02F 1/13378* (2013.01); *G02F 1/1391* (2013.01); *G03F 7/0002* (2013.01); *G02F 2001/133792* (2013.01); *G03F 1/80* (2013.01)

(58) Field of Classification Search
None
See application file for complete search history.

(56) References Cited

U.S. PATENT DOCUMENTS

| 5,438,421 A | 8/1995 | Sugawara et al. |
| 6,137,121 A | 10/2000 | Yamamoto et al. |
| (Continued) | | |

FOREIGN PATENT DOCUMENTS

| JP | H10-26707 | 1/1998 |
| JP | H11-112014 | 4/1999 |
| (Continued) | | |

*Primary Examiner* — Edward J Glick
*Assistant Examiner* — David Y Chung
(74) *Attorney, Agent, or Firm* — Dentons US LLP

(57) ABSTRACT

Disclosed are a method for forming a pattern for liquid crystal orientation of a zenithal bi-stable liquid crystal panel, a liquid crystal orientation substrate including the pattern formed thereby, and a mask substrate used for forming the pattern. The method includes: (a) depositing a silicon-based compound on a silicon substrate, (b) forming a guide pattern on an upper portion of the deposited silicon-based compound layer by using an imprint lithography, (c) discontinuously exposing the silicon substrate by transferring a pattern from the guide pattern onto the silicon-based compound layer by dry etching, (d) forming a pattern in an asymmetrical form on the silicon substrate by wet etching, (e) removing the part of the remaining silicon-based compound layer, and then hydrophobically treating a pattern surface of the silicon substrate; and (f) transferring a pattern in an asymmetrical form onto a glass substrate by disposing the sur- (Continued)

face-treated silicon substrate to face the glass substrate, and supplying a dielectric therebetween.

16 Claims, 3 Drawing Sheets

(51) Int. Cl.
*G03F 7/00* (2006.01)
*G03F 1/80* (2012.01)

(56) References Cited

U.S. PATENT DOCUMENTS

| | | | |
|---|---|---|---|
| 6,335,775 | B1* | 1/2002 | Iwamura ............ G02F 1/13378 349/125 |
| 7,758,794 | B2* | 7/2010 | Chou .................... B29C 43/003 264/319 |
| 2005/0237471 | A1 | 10/2005 | Kawamura |
| 2006/0115603 | A1 | 6/2006 | Francis et al. |
| 2007/0080325 | A1 | 4/2007 | Goulding et al. |
| 2014/0234468 | A1* | 8/2014 | Taniguchi ............. G03F 7/0002 425/385 |
| 2014/0349485 | A1* | 11/2014 | Umekawa ............. B82Y 40/00 438/694 |

FOREIGN PATENT DOCUMENTS

| | | |
|---|---|---|
| JP | 2002-287146 | 10/2002 |
| JP | 2004-029391 | 1/2004 |
| JP | 2006-525387 | 11/2006 |
| JP | 2006-337697 | 12/2006 |
| KR | 10-1997-0004881 | 4/1997 |
| KR | 10-2007-0119624 | 12/2007 |
| KR | 10-2009-0054746 | 6/2009 |
| KR | 10-2015-0144936 | 12/2015 |

* cited by examiner (A)          (B)

| Off angle | ETCHING SHAPE | ETCHING DEPTH WHEN PITCH IS 1 μm | SCHEMATIC VIEW |
|---|---|---|---|
| 0° | ▽ | 0.71 | |
| 7° | ▽ | 0.7 | |
| 16° | ◁ | 0.63 | |
| 35.3° | ◁ | 0.35 | |

US 10,859,875 B2

METHOD FOR FORMING PATTERN FOR LIQUID CRYSTAL ORIENTATION OF ZENITHAL BI-STABLE LIQUID CRYSTAL PANEL, LIQUID CRYSTAL ORIENTATION SUBSTRATE INCLUDING PATTERN FORMED THEREBY, AND MASK SUBSTRATE USED FOR FORMING PATTERN

RELATED APPLICATIONS

This application is a National Stage Application of International Application No. PCT/KR2018/001898 filed on Feb. 13, 2018, which claims priority to and the benefit of Korean Patent Application No. 10-2017-0028839 filed in the Korean Intellectual Property Office on Mar. 7, 2017, the entire contents of which are incorporated herein by reference.

TECHNICAL FIELD

The present invention relates to a method for forming a pattern for liquid crystal orientation of a zenithal bi-stable liquid crystal panel, a liquid crystal orientation substrate including a pattern formed thereby, and a mask substrate used for forming the pattern, and more specifically, to a method for forming a pattern for liquid crystal orientation of a zenithal bi-stable liquid crystal panel, which can prevent or minimize unnecessary power consumption because the liquid crystal direction is maintained even at a zero-potential after application of voltage by forming an asymmetrical pattern on a liquid crystal orientation film of a zenithal bi-stable liquid crystal panel or a zenithal bi-stable device (ZBD), a liquid crystal orientation substrate including a pattern formed thereby, and a mask substrate used for forming the pattern.

BACKGROUND ART

In general, liquid crystals are opaquely oriented when voltage is applied to the liquid crystals during the driving, and conversely, liquid crystals are transparently oriented when voltage is not applied to the liquid crystals. However, when an on or off state needs to be maintained for a long period of time, such as in a sunroof or an e-book, unnecessary power loss is generated. In contrast, in a zenithal bi-stable liquid crystal panel including a nematic liquid crystal having memory characteristics capable of displaying information even in a state where voltage is not applied, after voltage is once applied, a liquid crystal direction is maintained even at a zero-potential, and the on/off is determined according to the direction of the voltage, so that unnecessary power consumption needs to be prevented or minimized by using such a liquid crystal panel.

REFERENCES OF THE RELATED ART

Korean Patent Application Laid-Open No. 10-2016-0039655

DETAILED DESCRIPTION OF THE INVENTION

Technical Problem

As previously examined, in a liquid crystal panel in a zenithal bi-stable state, a liquid crystal direction is maintained even at a zero-potential after voltage is once applied, so that unnecessary power consumption needs to be prevented or minimized by using a zenithal bi-stable liquid crystal panel. However, in order to make the zenithal bi-stable liquid crystal panel as described above, a pattern needs to be formed at a cycle of about 1 um on one surface or both surfaces of a liquid crystal orientation film, and in this case, the pattern needs to be asymmetrically formed. For this purpose, since a process of dry etching by reactive ion etching (RIE) and the like while a specimen in an inclined form is usually put inside a chamber is essentially performed, the size of the chamber needs to be very large, and the ion beam position of the specimen varies, so that there is a problem in that it is difficult to form a large-area uniform pattern.

Accordingly, an object of the present invention is to provide a method for forming a pattern for liquid crystal orientation of a zenithal bi-stable liquid crystal panel, which can prevent or minimize unnecessary power consumption because the liquid crystal direction is maintained even at a zero-potential after application of voltage by uniformly forming an asymmetrical pattern on a liquid crystal orientation film of a zenithal bi-stable liquid crystal panel, a liquid crystal orientation substrate including a pattern formed thereby, and a mask substrate used for forming the pattern.

Technical Solution

In order to achieve the object, the present invention provides a method for forming a pattern for liquid crystal orientation of a zenithal bi-stable liquid crystal panel, the method including: (a) depositing a silicon-based compound on a silicon substrate; (b) forming a guide pattern on an upper portion of the deposited silicon-based compound layer by using an imprint lithography; (c) discontinuously exposing the silicon substrate by transferring a pattern from the guide pattern onto the silicon-based compound layer by dry etching; (d) forming a pattern in an asymmetrical form on the silicon substrate by wet etching; (e) removing the remaining part of the silicon-based compound layer, and then hydrophobically treating a pattern surface of the silicon substrate; and (f) transferring a pattern in an asymmetrical form onto a glass substrate by disposing the surface-treated silicon substrate to face the glass substrate and supplying a dielectric therebetween.

Further, the present invention provides a liquid crystal orientation substrate including an asymmetrical pattern formed by the method for forming a pattern, the liquid crystal orientation substrate including: a lower substrate having the asymmetrical pattern on one side thereof; an upper substrate to face the pattern on the side of the lower substrate; and a liquid crystal disposed between the upper substrate and the lower substrate.

In addition, the present invention provides a mask substrate formed of a silicon material, where an asymmetrical pattern is formed, used for forming the liquid crystal orientation substrate pattern.

Advantageous Effects

According to a method for forming a pattern for liquid crystal orientation of a zenithal bi-stable liquid crystal panel, a liquid crystal orientation substrate including the pattern formed thereby, and a mask substrate used for forming the pattern according to the present invention, unnecessary power consumption can be prevented or minimized because a liquid crystal direction is maintained even at a zero-potential after application of voltage by uniformly forming an asymmetrical pattern on a liquid crystal orientation film of a zenithal bi-stable liquid crystal panel.

BEST MODE

Hereinafter, the present invention will be described in detail with reference to accompanying drawings.

Figure 1:
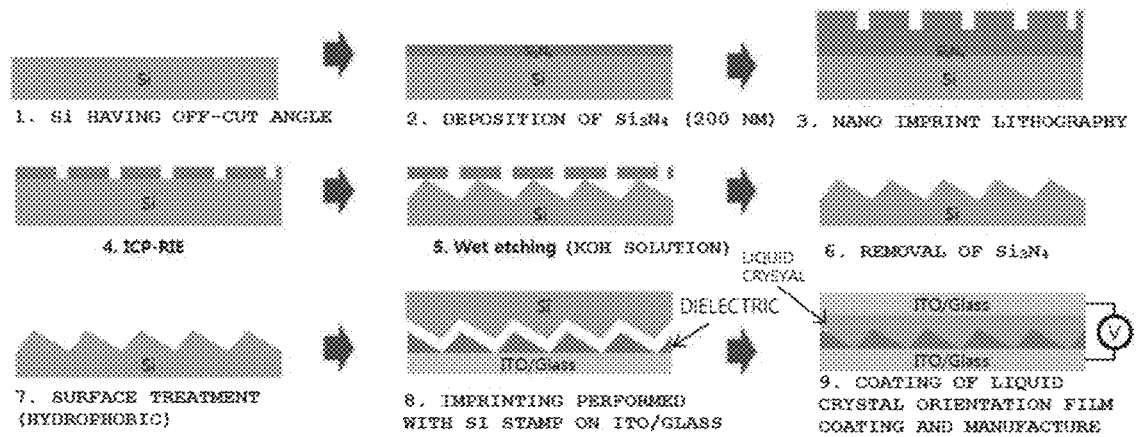
FIG. 1 is a schematic view of a process of forming a pattern for liquid crystal orientation of a zenithal bi-stable liquid crystal panel according to the present invention.

FIG. 1 is a schematic view of a process of forming a pattern for liquid crystal orientation of a zenithal bi-stable liquid crystal panel according to the present invention. When the present invention is described by referring to FIG. 1, a method for forming a pattern for liquid crystal orientation of a zenithal bi-stable liquid crystal panel according to the present invention, includes: (a) depositing a silicon-based compound on a silicon substrate, (b) forming a guide pattern on an upper portion of the deposited silicon-based compound layer by using an imprint lithography, (c) discontinuously exposing the silicon substrate by transferring a pattern from the guide pattern onto the silicon-based compound layer by dry etching, (d) forming a pattern in an asymmetrical form on the silicon substrate by wet etching, (e) removing the remaining part of the silicon-based compound layer, and then hydrophobically treating a pattern surface of the silicon substrate; and (f) transferring a pattern in an asymmetrical form onto a glass substrate by disposing the surface-treated silicon substrate to face the glass substrate, and supplying a dielectric therebetween.

The silicon substrate in step (a) has an off angle (or an off-cut angle), and means that the silicon substrate can be etched such that a pattern of a silicon substrate, which is formed, is asymmetric with respect to the surface of the silicon substrate. In step (a), a silicon-based compound deposited on a silicon substrate is a material which can be deposited on the upper portion of the silicon substrate to form a guide pattern by a nano imprint photolithography, means a compound including a nitrogen (N) or oxygen (O) atom in addition to silicon (Si), and can be SiN, $SiN_4$, $Si_3N_4$, $Si_2N_3$, SiO, $SiO_2$, and the like.

The step of forming a guide pattern on an upper portion of the deposited silicon-based compound layer by using the imprint lithography (step b) and the step of discontinuously exposing the silicon substrate by transferring a pattern from the guide pattern onto the silicon-based compound layer by dry etching (step c) are carried out by a typical nano imprint lithography method which is subjected to a process such as coating, exposure, curing, and transferring, and a specific description thereof will be omitted.

As described above, when a pattern is formed on the silicon-based compound layer deposited onto the silicon substrate, a pattern in an asymmetrical form is formed on the silicon substrate by wet etching (step d). As described above, in a zenithal bi-stable liquid crystal panel including a nematic liquid crystal having memory characteristics capable of displaying information even in a state where voltage is not applied, after voltage is once applied, a liquid crystal direction is maintained even at a zero-potential, and the on/off is determined according to the direction of the voltage, so that unnecessary power consumption needs to be prevented or minimized by using such a liquid crystal panel. In order to make the zenithal bi-stable liquid crystal panel as described above, since a pattern in an inclined form needs to be formed at a predetermined interval on one surface of a liquid crystal orientation film in order for the liquid crystal direction to be maintained, a pattern in the asymmetrical form which is not symmetric needs to be formed on the silicon substrate.

Thus, in the present invention, in order to form the pattern in the asymmetrical form as described above on the silicon substrate, first, when a silicon substrate (wafer) is initially manufactured, a surface corresponding to a position inclined at a predetermined angle from a vertical axis of a silicon ingot can be exposed by cutting the silicon substrate in a direction inclined at a predetermined angle from the vertical axis of the silicon ingot instead of in a vertical axis direction of the silicon ingot, and subsequently, a pattern having a V shape in an asymmetrical form is formed on the silicon substrate by wet etching the special silicon substrate as described above.

Figure 2:
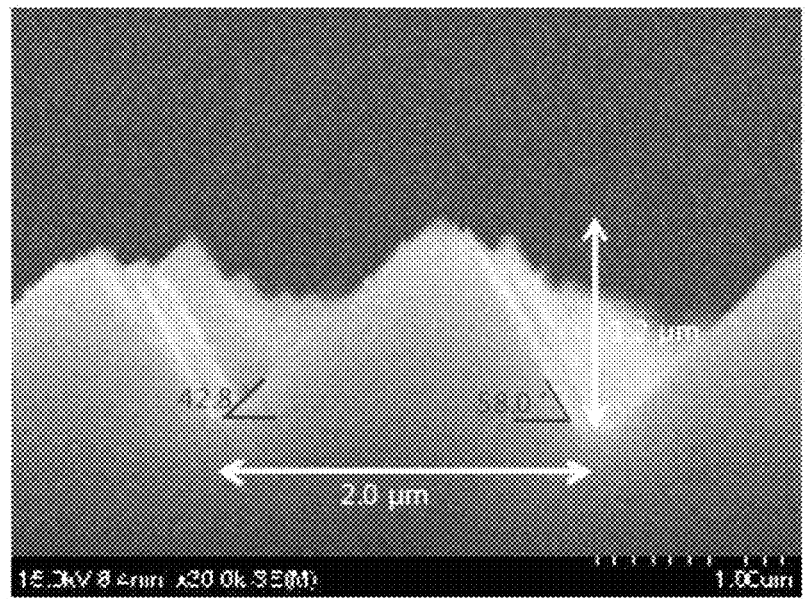
FIG. 2 is an image in which an asymmetrical pattern formed on a silicon substrate is measured by a scanning electron microscope according to an exemplary embodiment of the present invention.

Here, the angle inclined from the vertical axis is referred to as an off angle, and accordingly, the asymmetrical degree of the pattern formed on the silicon substrate can vary according to a target off angle. The off angle of the pattern formed on the silicon substrate as described above is more than 0° and less than 36°, preferably 3° to 20°, and when the off angle of the pattern formed on the silicon substrate is 0°, the liquid crystal orientation is not maintained because a pattern in a symmetrical form is formed, and when the off angle is more than 36°, there is concern in that the pattern may not be formed. Meanwhile, FIG. 2 is an image in which the asymmetrical pattern formed on the silicon substrate is measured by a scanning electron microscope according to the exemplary embodiment of the present invention, and the off angle in FIG. 2 is about 7°.

Further, a pitch (or cycle) of the pattern formed on the silicon substrate can vary according to the shape of the guide pattern or the method for forming a guide pattern, and can be 0.5 μm to 3 μm, preferably 0.7 μm to 2.5 μm, and more preferably 0.9 μm to 2 μm, and when the pitch of the pattern formed on the silicon substrate is less than 0.5 μm, due to the size of the liquid crystal, the number of liquid crystals which can be arranged between the patterns is not so many that there is a concern in that a problem can occur in that only the vertical orientation force operates in a stable form, and when the pitch is more than 3 μm, due to the distance between the patterns, an electric field is applied so weak that a problem can occur in that only the vertical orientation force operates in a stable form. Furthermore, the depth of the pattern formed on the silicon substrate can vary according to the pitch value of the pattern, and can be about 0.3 µm to about 2.2 µm, preferably 0.4 µm to 1.8 µm, and more preferably 0.6 µm to 1.5 µm.

Figure 3:
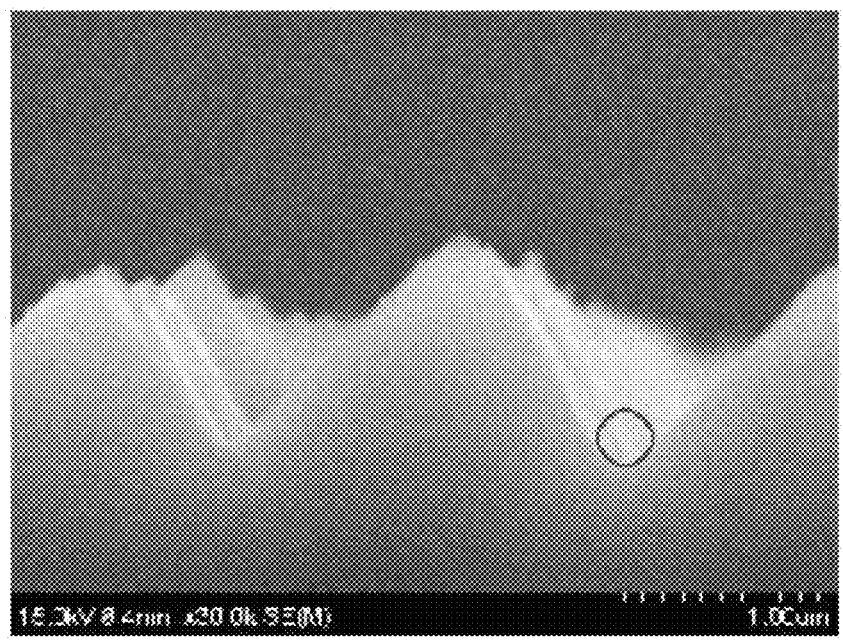
FIG. 3 is an image of a pattern observed by a scanning electron microscope to describe a radius of curvature of a groove of an asymmetrical pattern formed on a silicon substrate according to an exemplary embodiment of the present invention.

Besides, a radius (R) of curvature of a groove of the pattern formed on the silicon substrate is 50 nm to 1,000 nm, preferably 100 nm to 500 nm, and more preferably 150 nm to 300 nm, and when the radius of curvature of a groove of the pattern is more than the above range, the restoration force of the liquid crystal becomes larger than the force to orient the liquid crystals in parallel, so that a problem can occur in that the bi-stability deteriorates. FIG. 3 is an image of a pattern observed by a scanning electron microscope to describe a radius of curvature of a groove of an asymmetrical pattern formed on a silicon substrate according to an exemplary embodiment of the present invention, and the radius of curvature of a groove the pattern as described above means a radius of a virtual circle when the virtual circle is maximally adhered to a pattern groove (marked with ○ in FIG. 3) disposed between a pattern and another pattern, as illustrated in FIG. 3.

Meanwhile, the shape of the asymmetrical pattern formed on the silicon substrate can vary according to the off angle of the silicon substrate, and can be an asymmetrical triangular shape, an asymmetrical quadrangular shape, and the like. Furthermore, examples of the method for forming a guide pattern include laser interference lithography, laser direct structuring, e-beam lithography, imprint lithography, photo lithography, and the like, and it is preferred to use the imprint lithography.

Figure 4:
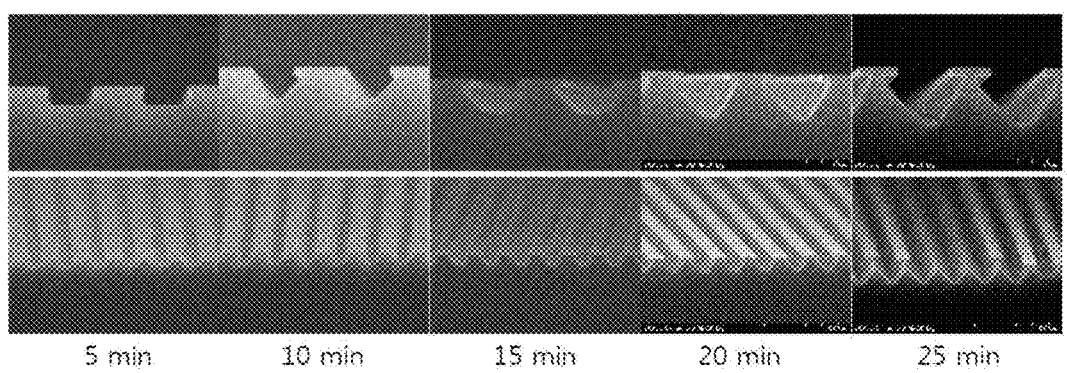
FIG. 4 is an image of an asymmetrical pattern shape formed on a silicon substrate according to an exemplary embodiment of the present invention observed by a scanning electron microscope over the etching time.

Further, as a wet etchant used to form a pattern in an asymmetrical form on the silicon substrate, a typical wet etchant can be used, and examples thereof include a mixture solution including $HNO_3$, $H_2O$, and HF in addition to KOH and $H_3PO_4$. Besides, FIG. 4 is an image of an asymmetrical pattern shape formed on a silicon substrate according to an exemplary embodiment of the present invention observed by a scanning electron microscope over the etching time, and as the etching time elapses as described above, an asymmetrical pattern is formed on the silicon substrate, and the time taken can vary according to the etching conditions, that is, the type of etchant, the presence of stirring and exposure, the heating substrate, the types of washing solution (DI water) and solvent (isopropyl alcohol (IPA), and the like), the amounts of washing solution and solvent used, and the like.

Figures 5, 6:
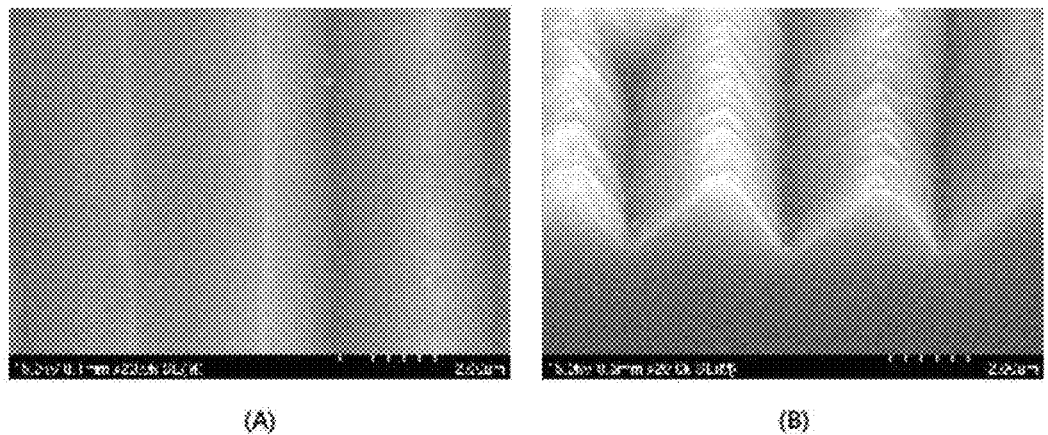
FIG. 5 is an image of a silicon substrate asymmetrical pattern shape observed by a scanning electron microscope after a guide pattern is removed according to an exemplary embodiment of the present invention.
FIG. 6 is a view illustrating an etching shape varying according to the off angle of an asymmetrical pattern according to an exemplary embodiment of the present invention.

Next, the remaining part of the silicon-based compound layer is removed, and then a pattern surface of the silicon substrate is hydrophobically treated (step e). The remaining part of the silicon-based compound layer (or the guide pattern) can be removed by using an acid, and can be removed by immersing the remaining part of the silicon-based compound layer into, for example, hydrofluoric acid (HF) or hydrofluoric acid diluted with ammonium fluoride for about 1 min to about 10 min, preferably, about 2 min to about 5 min. Further, as a hydrophobic polymer compound used to surface-treat the pattern of the silicon substrate, it is possible to use a typical polymer compound having hydrophobicity, such as perfluoropolyether (PFPE) and heptadecafluoro-1,1,2,2-tetrahydrodecyl trimethoxy silane, and as described above, the reason that the pattern of the silicon substrate is surface-treated is for smoothly separating a silicon substrate from a glass substrate after a pattern transferring step to be described below (that is, the silicon substrate serves as a mask). Meanwhile, FIG. 5 is an image of a silicon substrate asymmetrical pattern shape observed by a scanning electron microscope after a guide pattern is removed according to an exemplary embodiment of the present invention, FIG. 5(A) is an image seen from above, and FIG. 5(B) is an image seen from above at an angle of at about 45°.

Finally, a pattern in an asymmetrical form is transferred onto a glass substrate by allowing the surface-treated silicon substrate to face the glass substrate, and supplying a dielectric therebetween (step f). The step f is a step for manufacturing a liquid crystal orientation substrate substantially used, and is a process of forming a pattern which is the same as the asymmetrical pattern of the silicon substrate on one surface of the glass substrate by contacting and transferring the asymmetrical pattern of the silicon substrate onto the glass substrate, specifically, the dielectric supplied and disposed between the silicon substrate and the glass substrate, and in other words, the silicon substrate serves as a so-called mask substrate or stamp, and the asymmetric pattern is imprinted on the glass substrate by using the silicon substrate.

On the glass substrate, materials such as a metal oxide such as an electrically conductive polymer, an electrically conductive metal, an electrically conductive nanowire or indium tin oxide (ITO) can be deposited as an electrode layer, and the glass substrate can be replaced with an inorganic substrate such as a crystalline or non-crystalline silicon substrate, quartz or an ITO film, a plastic substrate, and the like, if necessary. Besides, as the dielectric supplied between the silicon substrate and the glass substrate, a typical dielectric having dielectric properties, such as perfluoropolyether (PFPE), polyimide (PI), and polyethylene terephthalate (PET) can be used without particular limitation.

After the asymmetrical pattern is formed on the glass substrate by the method for forming a pattern for liquid crystal orientation of zenithal bi-stable liquid crystal panel according to the present invention as described above, the silicon substrate in a state of facing the glass substrate is replaced with another glass substrate, a liquid crystal is supplied between the other glass substrate and the glass substrate in which the pattern is formed, and then voltage is applied to the liquid crystal, so that it is possible to manufacture a zenithal bi-stable liquid crystal panel in which the liquid crystal orientation is maintained even at a zero-potential. Moreover, before the liquid crystal is supplied, the pattern surface of the glass substrate in which the pattern is formed is coated with a liquid crystal orientation film having a thickness of 1,000 Å or less, which is formed of polyimide and the like so as to have hydrophobicity.

Further, the present invention provides a liquid crystal orientation substrate including: an asymmetrical pattern formed by the method for forming a pattern for liquid crystal orientation of a zenithal bi-stable liquid crystal panel, that is to say, including: a lower substrate having the asymmetrical pattern on one side thereof; an upper substrate to face the pattern on the side of the lower substrate; and a liquid crystal disposed between the upper substrate and the lower substrate.

Here, the upper substrate and the lower substrate can be an inorganic substrate such as a glass substrate, a crystalline or non-crystalline silicon substrate, quartz or an ITO film, a plastic substrate, and the like, and besides, a detailed description on the constituent elements of the liquid crystal orientation substrate is applied with appropriate modifications to the method for forming the pattern. Meanwhile, the zenithal bi-stable liquid crystal panel can be used as an electronic point of purchase (epop), an e-book or e-paper, a low-power display signboard, a sunroof, and the like.

In addition, the present invention provides a mask substrate formed of a silicon material, where an asymmetrical pattern is formed, used for forming the liquid crystal orientation substrate pattern.

When the method for forming a pattern for liquid crystal orientation of a zenithal bi-stable liquid crystal panel according to the present invention, the liquid crystal orientation substrate including the pattern formed thereby, and the mask substrate used for forming the pattern as described above are used, there is an advantage in that unnecessary power consumption can be prevented or minimized because the liquid crystal direction is maintained even at a zero-potential after application of voltage by uniformly forming an asymmetrical pattern on a liquid crystal orientation film of a zenithal bi-stable liquid crystal panel.

Mode for Invention

Hereinafter, preferred examples will be suggested to help understand the present invention, but the following Examples are only provided to illustrate the present invention, and it is apparent to the person skilled in the art that various alterations and modifications are possible within the scope and technical spirit of the present invention, and it is natural that such alterations and modifications also fall within the accompanying claims.

EXAMPLE 1

Formation of Asymmetrical Pattern for Liquid Crystal Orientation of Zenithal Bi-Stable Liquid Crystal Panel After silicon nitride ($Si_3N_4$) was deposited onto a silicon substrate and a guide pattern was formed on an upper portion of the deposited silicon nitride layer by using photolithography, a pattern was transferred from the formed guide pattern onto the silicon nitride layer by dry etching, and as a result, the silicon substrate was discontinuously exposed, and subsequently, a pattern in an asymmetrical form, having an off angle of 7° was formed on the silicon substrate by using a wet etching method, the remaining silicon nitride layer was removed, and then the pattern surface of the silicon substrate was hydrophobically treated. Subsequently, a surface of the silicon substrate on which the pattern was formed was allowed to face a glass substrate, and a pattern in an asymmetrical form, having an off angle of 7° was formed on the glass substrate by supplying perfluoropolyether which is a dielectric therebetween.

EXAMPLE 2

Formation of Asymmetrical Pattern for Liquid Crystal Orientation of Zenithal Bi-Stable Liquid Crystal Panel A pattern was formed on the glass substrate in the same manner as in Example 1, except that a pattern in an asymmetrical form, having an off angle of 16° instead of 7° was formed on the silicon substrate and the glass substrate.

EXAMPLE 3

Formation of Asymmetrical Pattern for Liquid Crystal Orientation of Zenithal Bi-Stable Liquid Crystal Panel A pattern was formed on the glass substrate in the same manner as in Example 1, except that a pattern in an asymmetrical form, having an off angle of 35.3° instead of 7° was formed on the silicon substrate and the glass substrate.

COMPARATIVE EXAMPLE 1

Formation of Pattern in Symmetrical Shape

A pattern was formed on the glass substrate in the same manner as in Example 1, except that a pattern in a symmetrical form, having an off angle of 0° instead of 7° was formed on the silicon substrate and the glass substrate.

EXAMPLES 1 TO 3 AND COMPARATIVE EXAMPLE 1

Evaluation of Etching Shape and Liquid Crystal Orientation According to Off Angle of Pattern FIG. 6 is a view illustrating an etching shape varying according to the off angle of an asymmetrical pattern according to an exemplary embodiment of the present invention. As a result of evaluating the patterns formed on the glass substrates from Examples 1 to 3 and Comparative Example 1, the etching shape and the shape of the pattern formed on the glass substrate, respectively as illustrated in FIG. 6 could be identified, and in the case of Comparative Example 1 where the off angle was 0°, it could be seen that the pattern was formed in a symmetrical form, and the liquid crystal orientation was not maintained. In contrast, in Examples 1 to 3 where the off angle was more than 0°, it was confirmed that the pattern was formed in an asymmetrical form, and the liquid crystal orientation was maintained even at a zero-potential, and further, even in Examples 1 to 3 where the off angle was differently set, it could be seen that the liquid crystal orientation degrees were different from one another.

The invention claimed is:
1. A method for forming a pattern for liquid crystal orientation of a zenithal bi-stable liquid crystal panel, the method comprising:
   (a) depositing a silicon-based compound on a silicon substrate;
   (b) forming a guide pattern on an upper portion of the deposited silicon-based compound layer by using an imprint lithography;
   (c) discontinuously exposing the silicon substrate by transferring a pattern from the guide pattern onto the silicon-based compound layer by dry etching;
   (d) forming a pattern in an asymmetrical form on the silicon substrate by wet etching;
   (e) removing the remaining part of the silicon-based compound layer, and then hydrophobically treating a pattern surface of the silicon substrate; and
   (f) transferring the pattern in an asymmetrical form onto a glass substrate by disposing the surface-treated silicon substrate to face the glass substrate, and supplying a dielectric therebetween.

2. The method of claim 1, wherein an off angle of the pattern formed on the silicon substrate is more than 0° and less than 36°.

3. The method of claim 1, wherein a pitch of the pattern formed on the silicon substrate is 0.5 µm to 3 µm.

4. The method of claim 1, wherein a depth of the pattern formed on the silicon substrate is 0.3 µm to 2.2 µm.

5. The method of claim 1, wherein a radius of curvature of a groove of the pattern formed on the silicon substrate is 50 nm to 1,000 nm.

6. The method of claim 1, wherein a shape of the asymmetrical pattern formed on the silicon substrate is an asymmetrical triangular shape or an asymmetrical quadrangular shape.

7. The method of claim 1, wherein the silicon substrate is a mask substrate for forming a pattern on a glass substrate.

8. The method of claim 1, wherein the silicon-based compound deposited onto the silicon substrate is selected from the group consisting of SiN, $SiN_4$, $Si_3N_4$, $Si_2N_3$, SiO, and $SiO_2$.

9. The method of claim 1, wherein the remaining part of the silicon-based compound layer is removed by using an acid.

10. The method of claim 1, wherein the pattern surface of the silicon substrate is hydrophobically treated by exposing the pattern surface to a hydrophobic polymer compound selected from the group consisting of perfluoropolyether and heptadecafluoro-1,1,2,2-tetrahydrodecyl trimethoxy silane.

11. The method of claim 1, wherein the glass substrate is deposited with a metal oxide selected from the group consisting of an electrically conductive polymer, an electrically conductive metal, an electrically conductive nanowire and indium tin oxide (ITO) as an electrode layer thereon, and the glass substrate is selected from the group consisting of an inorganic substrate of a crystalline or non-crystalline silicon substrate, a quartz film, an ITO film, and a plastic substrate.

12. The method of claim 1, wherein the pattern formed on the glass substrate is an asymmetrical pattern which is the same as the pattern formed on the silicon substrate.

13. A liquid crystal orientation substrate with an asymmetrical pattern formed according to the method for forming a pattern for liquid crystal orientation of a zenithal bi-stable liquid crystal panel of claim 1, the substrate comprising:
a lower substrate having the asymmetrical pattern on one side thereof;
an upper substrate disposed to face the pattern on the side of the lower substrate; and
a liquid crystal disposed between the upper substrate and the lower substrate.

14. The liquid crystal orientation substrate of claim 13, wherein the upper substrate and the lower substrate are selected from the group consisting of a glass substrate, an inorganic substrate of a crystalline silicon substrate, a non-crystalline silicon substrate, a quartz film, an ITO film, and a plastic substrate.

15. The liquid crystal orientation substrate of claim 13, wherein the zenithal bi-stable liquid crystal panel is selected from the group consisting of an electronic point of purchase (epop), an e-book, an e-paper, a low-power display signboard, and a sunroof.

16. A mask substrate formed of a silicon material, in which the asymmetrical pattern used for forming the liquid crystal orientation substrate pattern of claim 13 is formed.

* * * * *